United States Patent
Zhou et al.

(10) Patent No.: US 7,408,384 B2
(45) Date of Patent: **\*Aug. 5, 2008**

(54) DRIVE CIRCUIT OF COMPUTER SYSTEM FOR DRIVING A MODE INDICATOR

(75) Inventors: Tong Zhou, Shenzhen (CN); Jia-Hui Tu, Shenzhen (CN)

(73) Assignees: Hong Fu Jin Precision Industry (Shenzhen) Co., Ltd., Bao-an District, Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 125 days.

This patent is subject to a terminal disclaimer.

(21) Appl. No.: 11/312,725

(22) Filed: Dec. 19, 2005

(65) Prior Publication Data

US 2006/0138967 A1    Jun. 29, 2006

(30) Foreign Application Priority Data

Dec. 25, 2004    (CN)    ............. 2004 1 0091895

(51) Int. Cl.
*H03K 19/0175* (2006.01)

(52) U.S. Cl. ............... 326/81; 326/83; 326/84; 326/89; 326/124; 326/126; 326/127

(58) Field of Classification Search .......... 326/126, 326/82–84, 89, 124, 127
See application file for complete search history.

(56) References Cited

U.S. PATENT DOCUMENTS

| | | | | |
|---|---|---|---|---|
| 4,657,670 | A * | 4/1987 | Newton | 210/85 |
| 7,030,773 | B2 * | 4/2006 | Peterson et al. | 340/815.4 |
| 7,043,855 | B2 * | 5/2006 | Heilman et al. | 34/389 |
| 2001/0010472 | A1 * | 8/2001 | Kamiya | 327/108 |
| 2005/0134191 | A1 * | 6/2005 | Wong et al. | 315/200 A |
| 2006/0139064 | A1 * | 6/2006 | Zhou et al. | 327/108 |
| 2006/0256050 | A1 * | 11/2006 | Ikeda | 345/82 |

FOREIGN PATENT DOCUMENTS

CN    03236782.1    4/2004

\* cited by examiner

*Primary Examiner*—Samir A. Ahmed
*Assistant Examiner*—Gandhi Thirugnanam
(74) *Attorney, Agent, or Firm*—Morris Manning Martin LLP; Tim Tingkang Xia, Esq.

(57) ABSTRACT

A drive circuit of a computer system is for driving a mode indicator. The computer system includes a first port and a second port. The mode indicator includes a first receiving end and a second receiving end. The drive circuit includes a first input end connected to the first port, a second input end connected to the second port, a first output end connected to the first receiving end, a second output end connected to the second receiving end. A power supply is connected to the first input end and the second input end via a first resistor and a second resistor respectively. The mode indicator is dichromatic and has two LEDs emitting non-matching colored light.

10 Claims, 2 Drawing Sheets

DRIVE CIRCUIT OF COMPUTER SYSTEM FOR DRIVING A MODE INDICATOR

Related subject matter is disclosed in a U.S. patent application entitled "DRIVE CIRCUIT OF COMPUTER SYSTEM FOR DRIVING A MODE INDICATOR" filed on Dec. 9, 2005 with application Ser. No. 11/297,893, which is assigned to the same assignee as that of the present application.

BACKGROUND OF THE INVENTION

1. Field of the Invention

The present invention relates to drive circuits of computer systems, and particularly to a drive circuit which can drive a mode indicator to show a working and a sleeping status of the computer system.

2. General Background

Conventionally, to save power sources, a sleeping mode is used in a computer system. Accordingly, an indicator is arranged in each of a PCB and a monitor, to show a working status or a sleeping status of the computer and the monitor. CN. Pat. No. 03236782.1 discloses a circuit controlled by a single chip to drive an indicator. The single chip uses a program to control the circuit. The indicator light is steadily on to show a working status. The indicator light flickers to show a sleeping status.

However, a drive circuit of the indicator must be controlled by the single chip. It is unduly complex to use the single chip because a controlling program is required. In addition, it is costly to use the single chip to control the indicator. Furthermore, the single chip is not suitable for controlling more than one indicator, which may be required in some computer systems.

What is needed is a drive circuit which can drive a mode indicator to show a working and a sleeping status of the computer system.

SUMMARY

A drive circuit of a computer system is for driving a mode indicator. The computer system includes a first port and a second port. The mode indicator includes a first receiving end and a second receiving end. The drive circuit includes a first input end connected to the first port, a second input end connected to the second port, a first output end connected to the first receiving end, a second output end connected to the second receiving end, a first power supply, a first transistor having a base connected to the first input end and a collector connected to the first power supply, and a second transistor having a base connected to the second input end and a collector connected to the first power supply. The collectors of the first and second transistors are separately connected to the first and second output ends. Emitters of the first and second transistors are grounded. A second power supply is connected to the first input end and the second input end via a first resistor and a second resistor respectively. The mode indicator is dichromatic and has two LEDs emitting non-matching colored light.

It is simple and economical to use the drive circuit to drive the mode indicator for showing the working status of the computer system. Furthermore, it is convenient to have more indicating space reserved, in case of functional improvement of the computer system in future.

Other advantages and novel features will become more apparent from the following detailed description when taken in conjunction with the accompanying drawings, in which:

DETAILED DESCRIPTION OF THE EMBODIMENT

Figure 1:
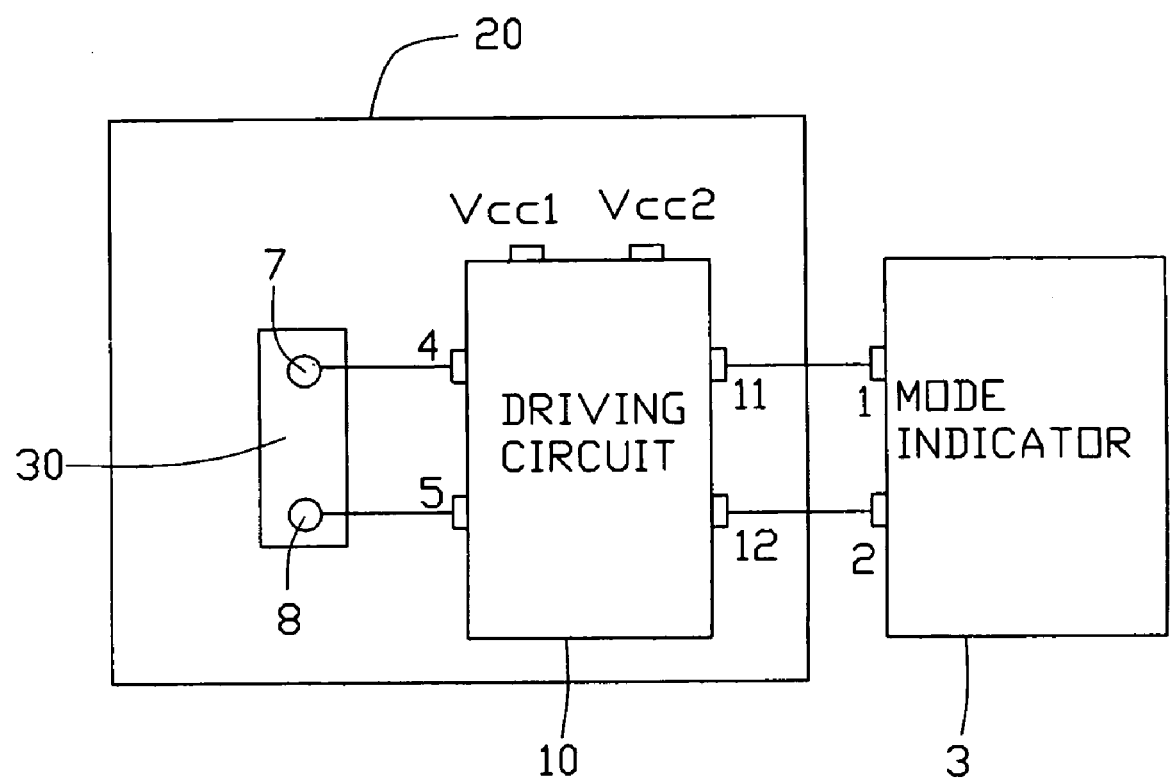
FIG. 1 is a block diagram of a drive circuit of a computer system, for driving a mode indicator in accordance with a preferred embodiment of the present invention.

Referring to FIG. 1, a drive circuit 10 in accordance with a preferred embodiment of the present invention is shown for driving a mode indicator 3 in an electronic system like a computer system. The computer system includes a motherboard 20 with a south bridge chip 30 installed thereon. The south bridge chip 30 includes a first port 7 for outputting a working signal, and a second port 8 for outputting a sleeping signal. The drive circuit 10 includes a first input end 4 connected to the first port 7, a second input end 5 connected to the second port 8, a first driving end 11, and a second driving end 12. The mode indicator 3 includes a first receiving end 1 connected to the first driving end 11, and a second receiving end 2 connected to the second driving end 12.

Figure 2:
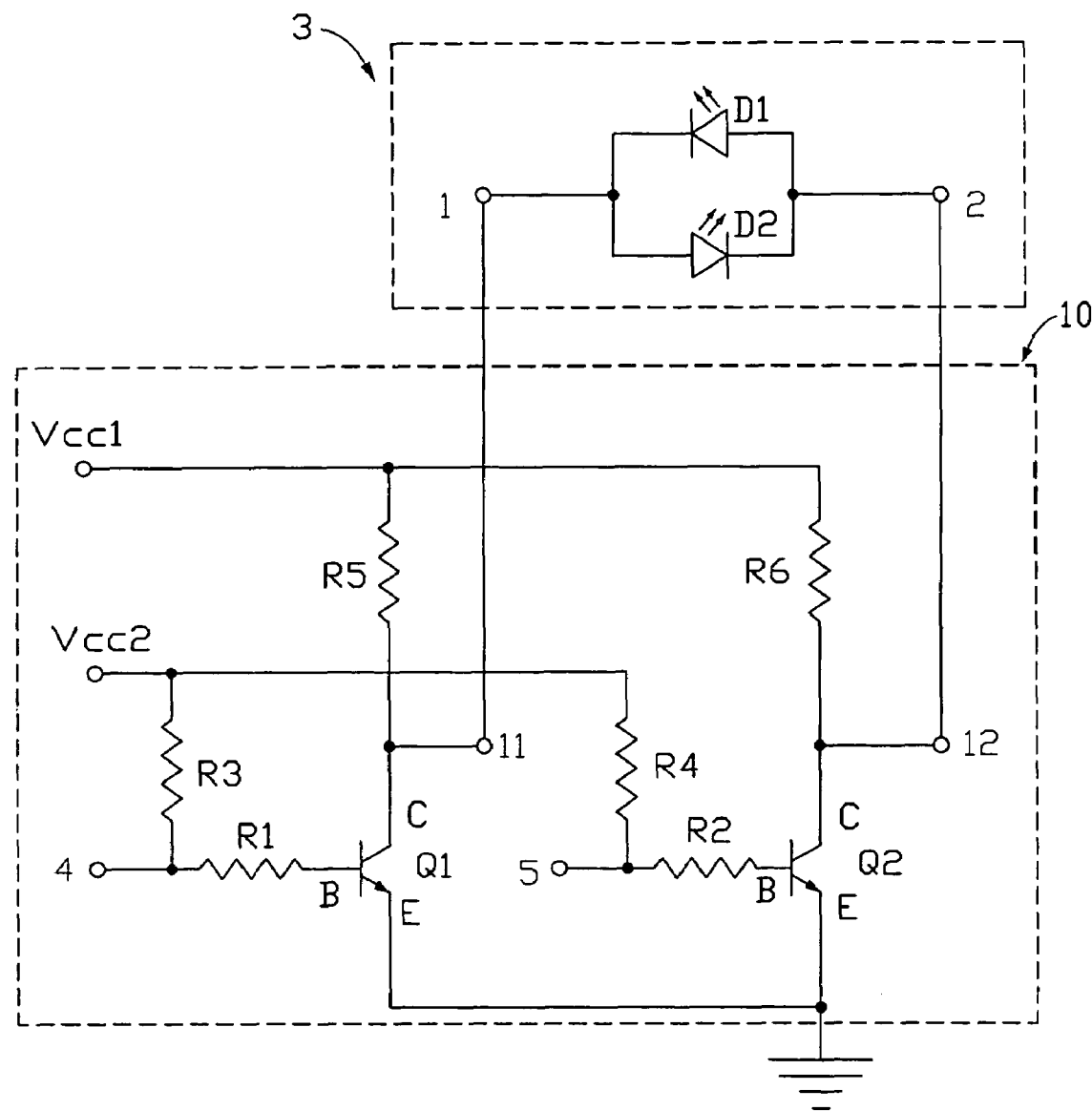
FIG. 2 is a circuit diagram of the drive circuit of FIG. 1.

Referring to FIG. 2, the mode indicator 3 is dichromatic. The mode indicator 3 includes a first LED D1, and a second LED D2 connected inversely in parallel between the first receiving end 1 and the second receiving end 2. The first LED D1 and the second LED D2 emit lights with different color. For example, the first LED D1 emits a green light, and the second LED D2 emits an orange light.

The drive circuit 10 includes a first transistor Q1, a second transistor Q2, a first power supply Vcc1, a second power supply Vcc2, and a number of resistors R1~R6. The first power supply Vcc1 is provided with a 5V voltage, and the second power supply Vcc2 is provide with a 3V voltage. The resistor R1 is connected between the first input end 4 and a base of the first transistor Q1. An emitter of the first transistor Q1 is grounded. A collector of the first transistor Q1 is coupled to the first power supply Vcc1 via the resistor R5. The first driving end 11 is at a node between the resistor R5 and the collector of the first transistor Q1. The resistor R2 is connected between the second input end 5 and a base of the second transistor Q2. An emitter of the second transistor Q2 is grounded. The resistor R6 is connected between the power supply Vcc1 and a collector of the second transistor Q2. The second driving end 12 is at a node between the resistor R6 and the collector of the second transistor Q2. The second power supply Vcc2 is coupled to the first input end 4 via the resistor R3, and the second power supply Vcc2 is coupled to the second input end 5 via the resistor R4.

When the computer system is working, an output voltage of the first port 7 of the south bridge chip 30 is at a high level, and an output voltage of the second port 8 of the south bridge 30 is at a low level. Therefore the first transistor Q1 is turned on, and the second transistor Q2 is turned off. An electric current passes through the resistor R6, the first LED D1, and the first transistor Q1. Accordingly, the first LED D1 is powered to emit a green light at the mode indicator 3.

When the computer system is sleeping, the output voltage of the second port 8 of the south bridge chip 30 is at a high level, and the output voltage of the first port 7 of the south bridge chip 30 is at a low level. Therefore the second transistor Q2 is turned on, and the first transistor Q1 is turned off. An electric current passes through the resistor R5, the second LED D2, and the second transistor Q2. Accordingly, the second LED D2 is powered to emit an orange light at the mode indicator 3.

When the computer system is changing between the working mode and the sleeping mode, if the high level of the output voltage of the first port 7 and the second port 8 of the south bridge chip 30 is too weak to drive the transistors Q1 and Q2, the second voltage Vcc2 can assist to turn on the transistors Q1 and Q2. And resistances of the resistors R3 and R4 are high enough to prevent the second voltage Vcc2 driving the transistors Q1 and Q2 by itself.

The drive circuit 10 also can be used to show a working status of other apparatuses in the computer system. The first input end 4 and the second input end 5 are separately connected to corresponding output ports of the apparatuses. The indicator 3 can be mounted on the enclosure of the computer, and can also be mounted on the monitor to show the working status of the computer system.

It is believed that the present embodiment and their advantages will be understood from the foregoing description, and it will be apparent that various changes may be made thereto without departing from the spirit and scope of the invention or sacrificing all of its material advantages, the examples hereinbefore described merely being a preferred or exemplary embodiments of the invention.

What is claimed is:

1. A drive circuit of a computer system for driving a mode indicator, the computer system comprising a control chip with a first port and a second port, the mode indicator comprising a first receiving end and a second receiving end, the drive circuit comprising:
   a first input end adapted to connect to the first port;
   a second input end adapted to connect to the second port;
   a first output end adapted to connect to the first receiving end;
   a second output end adapted to connect to the second receiving end;
   a first power supply and a second power supply, the second power supply connected to the first input end and the second input end via a first resistor and a second resistor respectively;
   a first transistor having a base connected to the first input end, a collector connected to the first output end and the first power supply respectively, and an emitter connected to the ground; and
   a second transistor having a base connected to the second input end, a collector connected to the second output end and the first power supply respectively, and an emitter connected to the ground, wherein the first input end can receive a working signal from the first port of the control chip, and the second input end can receive a sleeping signal from the second port of the control chip, the first power supply is adapted to receive a 5V voltage, the second power supply is adapted to receive a 3V voltage.

2. The drive circuit as claimed in claim 1, wherein a third resistor is connected between the first input end and the base of the first transistor, and a fourth resistor is connected between the second input end and the base of the second transistor.

3. The drive circuit as claimed in claim 2, wherein a fifth resistor is connected between the first power supply and the collector of the first transistor, and a sixth resistor is connected between the first power supply and the collector of the second transistor.

4. The drive circuit as claimed in claim 1, wherein the first and second output ends can output signals for display by the mode indicator.

5. A drive circuit of a computer system for driving a mode indicator, the computer system computer comprising a control chip with a first port and a second port, the mode indicator comprising a first receiving end and a second receiving end, the drive circuit comprising:
   a first switch controlled by the first port of the control chip and connected between a first power supply and the ground for controlling the path receiving the power to be forwarded to the first receiving end;
   a second switch controlled by the second port of the control chip and connected between the first power supply and the ground for controlling the path receiving the power to be forwarded to the second receiving end, wherein the first power supply is adapted to receive a 5V voltage; and
   a second power supply connected to the first port and the second port via a first resistor and a second resistor respectively, wherein the second power supply is adapted to receive a 3V voltage.

6. The drive circuit as claimed in claim 5, wherein the first and the second switches are transistors.

7. The drive circuit as claimed in claim 5, wherein the first switches can receive a working signal from the first port of the control chip, and the second switches can receive a sleeping signal from the second port of the control chip.

8. The drive circuit as claimed in claim 5, wherein the first and the second switches can output signals for the mode indicator displayed by dichromatic.

9. A circuit assembly for indicating statuses of an electronic system, comprising:
   a plurality of indicators definably corresponding to statuses of an electronic system, comprising at least two indicators connected inversely in parallel with an anode of one indicator connected to a cathode of the other indicator, and a cathode of the one indicator connected to an anode of the other indicator;
   a first power supply capable of powering said plurality of indicators, wherein the first power supply is adapted to receive a 5V voltage;
   a first switch electrically connectable between said plurality of indicators and said power supply, said first switch capable of accepting a controllable output voltage signal from said electronic system and selectively electrically connecting said plurality of indicators with said power supply according to said controllable signal so as to indicate one status of said electronic system by means of said plurality of indicators; and
   a second switch electrically connectable between said plurality of indicators and said power supply beside said first switch, said second switch capable of accepting another controllable output voltage signal from said electronic system and selectively electrically connecting said plurality of indicators with said power supply according to said another controllable signal so as to indicate another status of said electronic system by means of said plurality of indicators,
   a second power supply different from said first power supply and electrically connectable to said first and second switches respectively so as to enhance ability of said first and second switches to accept said controllable signal, wherein the second power supply is adapted to receive a 3V voltage.

10. The circuit assembly as claimed in claim 9, wherein at least two of said plurality of indicators are integrally included in a dichromatic mode indicator.

* * * * *